US010535644B1

(12) United States Patent
Kuo et al.

(10) Patent No.: US 10,535,644 B1
(45) Date of Patent: Jan. 14, 2020

(54) MANUFACTURING METHOD OF PACKAGE ON PACKAGE STRUCTURE

(71) Applicant: Taiwan Semiconductor Manufacturing Co., Ltd., Hsinchu (TW)

(72) Inventors: Hsuan-Ting Kuo, Taichung (TW); Ching-Hua Hsieh, Hsinchu (TW); Cheng-Ting Chen, Taichung (TW); Hsiu-Jen Lin, Hsinchu County (TW); Hao-Jan Pei, Hsinchu (TW); Yu-Peng Tsai, Taipei (TW); Chia-Lun Chang, Tainan (TW); Chih-Chiang Tsao, Taoyuan (TW); Philip Yu-shuan Chung, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/059,052

(22) Filed: Aug. 9, 2018

Related U.S. Application Data

(60) Provisional application No. 62/691,628, filed on Jun. 29, 2018.

(51) Int. Cl.

| | |
|---|---|
| ***H01L 23/00*** | (2006.01) |
| ***H01L 25/00*** | (2006.01) |
| ***H01L 23/31*** | (2006.01) |
| ***H01L 27/06*** | (2006.01) |
| ***H01L 21/56*** | (2006.01) |
| ***H01L 21/768*** | (2006.01) |
| ***H01L 23/522*** | (2006.01) |
| ***H01L 21/683*** | (2006.01) |

(52) U.S. Cl.
CPC .............. *H01L 25/50* (2013.01); *H01L 21/56* (2013.01); *H01L 21/6836* (2013.01);
(Continued)

(58) Field of Classification Search
CPC ..... H01L 25/50; H01L 21/56; H01L 21/6836; H01L 21/76871; H01L 23/3128;
(Continued)

(56) References Cited

U.S. PATENT DOCUMENTS

2002/0014685 A1* 2/2002 Tsukahara ............... H01L 24/11 257/673
2005/0057856 A1* 3/2005 Kira ......................... H01L 21/56 360/234.4
(Continued)

FOREIGN PATENT DOCUMENTS

TW 201731048 9/2017

OTHER PUBLICATIONS

"Office Action of Taiwan Counterpart Application", dated Jun. 11, 2019, p. 1-p. 3.

*Primary Examiner* — Kimberly N Rizkallah
*Assistant Examiner* — Alexander Belousov
(74) *Attorney, Agent, or Firm* — JCIPRNET

(57) ABSTRACT

A manufacturing method of a package on package structure includes the following steps. A first package is provided on a tape carrier, wherein the first package includes an encapsulated semiconductor device, a first redistribution structure disposed on a first side of the encapsulated semiconductor device, and a plurality of conductive bumps disposed on the first redistribution structure and attached to the tape carrier. A second package is mounted on the first package through a plurality of electrical terminals by a thermo-compression bonding process, which deforms the conductive bumps into a plurality of deformed conductive bumps. Each of the deformed conductive bumps comprises a base portion connecting the first redistribution structure and a tip portion connecting the base portion, and a curvature of the base portion is substantially smaller than a curvature of the tip portion.

20 Claims, 13 Drawing Sheets

(52) U.S. Cl.
CPC .... *H01L 21/76871* (2013.01); *H01L 23/3128* (2013.01); *H01L 23/5226* (2013.01); *H01L 24/17* (2013.01); *H01L 24/33* (2013.01); *H01L 27/0688* (2013.01); *H01L 2224/02372* (2013.01); *H01L 2224/02373* (2013.01)

(58) Field of Classification Search
CPC ..... H01L 23/5226; H01L 24/17; H01L 24/33; H01L 27/0688; H01L 2224/02372; H01L 2224/02373
See application file for complete search history.

(56) References Cited

U.S. PATENT DOCUMENTS

2006/0170112 A1* 8/2006 Tanaka .................. H01L 23/481 257/777
2013/0137216 A1* 5/2013 Ito ....................... H01L 25/0652 438/108
2013/0187270 A1* 7/2013 Yu ....................... H01L 23/5389 257/737
2014/0103527 A1* 4/2014 Marimuthu ....... H01L 23/49833 257/737
2014/0217597 A1* 8/2014 Lin ......................... H01L 24/19 257/773
2015/0187723 A1* 7/2015 Huang ................ H01L 23/3135 257/738
2015/0348904 A1* 12/2015 Huang ................ H01L 23/5383 257/774
2016/0197067 A1* 7/2016 Wu ..................... H01L 21/4853 438/107
2017/0084543 A1* 3/2017 Lin ......................... H01L 24/19
2018/0151507 A1* 5/2018 Chen ..................... B81C 99/007

* cited by examiner

MANUFACTURING METHOD OF PACKAGE ON PACKAGE STRUCTURE

CROSS-REFERENCE TO RELATED APPLICATION

This application claims the priority benefits of U.S. provisional application Ser. No. 62/691,628, filed on Jun. 29, 2018. The entirety of the above-mentioned patent application is hereby incorporated by reference herein and made a part of this specification.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
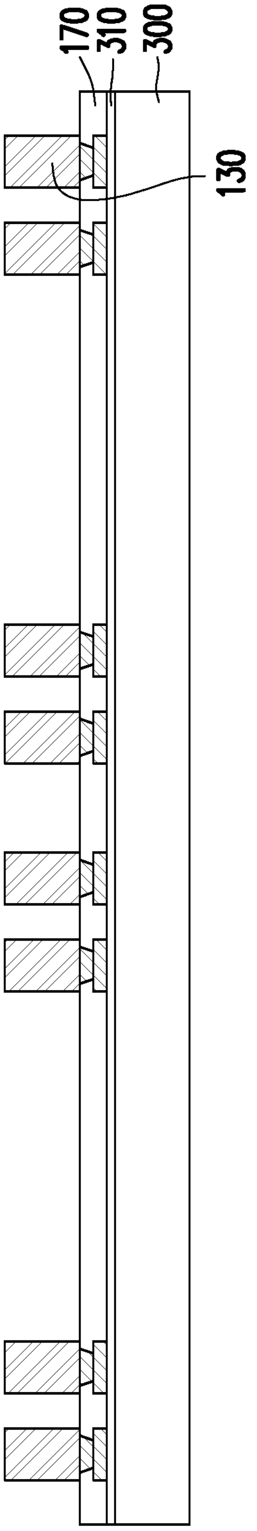
FIG. 1 to FIG. 13 illustrate cross sectional views of intermediate stages in the manufacturing of a package on package structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as “first,” “second,” “third,” “fourth,” and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 13 illustrate cross sectional views of intermediate stages in the manufacturing of a package on package structure according to some exemplary embodiments of the present disclosure. It is noted that the present disclosure will be described with respect to some embodiments in a specific context, namely a package on package structure. The concepts in the disclosure may also apply, however, to other semiconductor structures or circuits. A semiconductor package applicable for a package on package structure, a package on package structure and the method of forming the package on package structure are provided in accordance with various embodiments. The intermediate stages of forming the package on package structure are illustrated in accordance with some embodiments. The variations of the embodiments are discussed. Throughout the various views and illustrative embodiments, like reference numbers are used to designate like elements.

Figure 13:
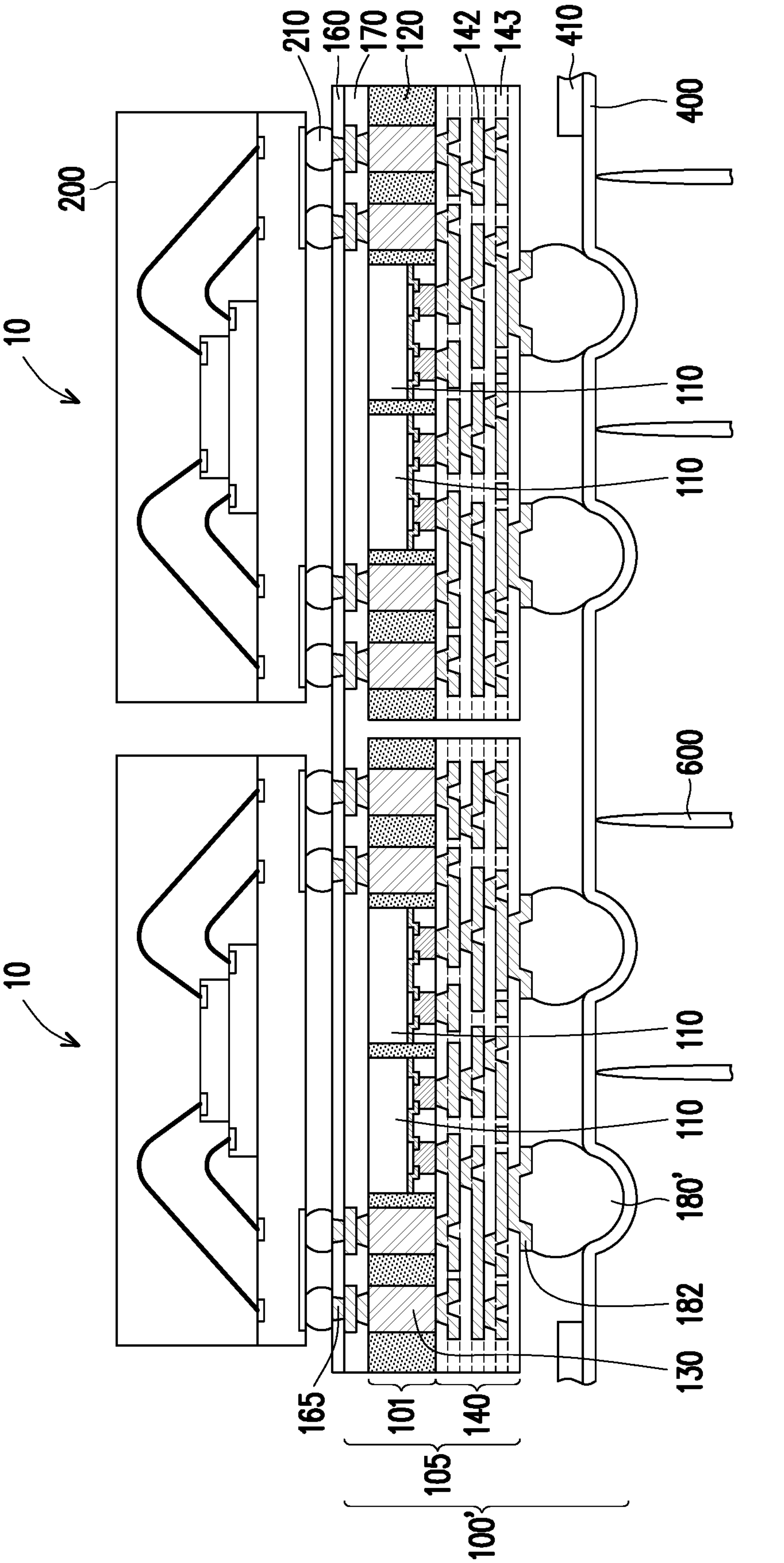

In some embodiments, the intermediate stages of forming the package on package structure as shown in FIG. 13 are described as follows. With reference to FIG. 1, a carrier substrate 300 is provided, and an adhesive layer 310 may be disposed on the carrier substrate 300. In some embodiments, the carrier substrate 300 may include, for example, silicon based materials, such as glass, ceramics or silicon oxide, or other materials, such as aluminum oxide, combinations of any of these materials, or the like. The carrier substrate 300 is planar in order to accommodate an attachment of semiconductor devices such as a semiconductor devices 110/110' (not illustrated in FIG. 1 but illustrated and discussed below with respect to FIG. 2 and FIG. 4). The adhesive layer 310 may be placed on the carrier substrate 300 in order to assist in the adherence of overlying structures (e.g. the redistribution structure 170). In an embodiment the adhesive layer 310 may include an ultra-violet glue, which reduces or loses its adhesive properties when exposed to ultra-violet light. However, other types of adhesives, such as pressure sensitive adhesives, radiation curable adhesives, light to heat conversion release coating (LTHC), epoxies, combinations of these, or the like, may also be used. The adhesive layer 310 may be placed onto the carrier substrate 300 in a semi-liquid or gel form, which is readily deformable under pressure.

Figure 6:
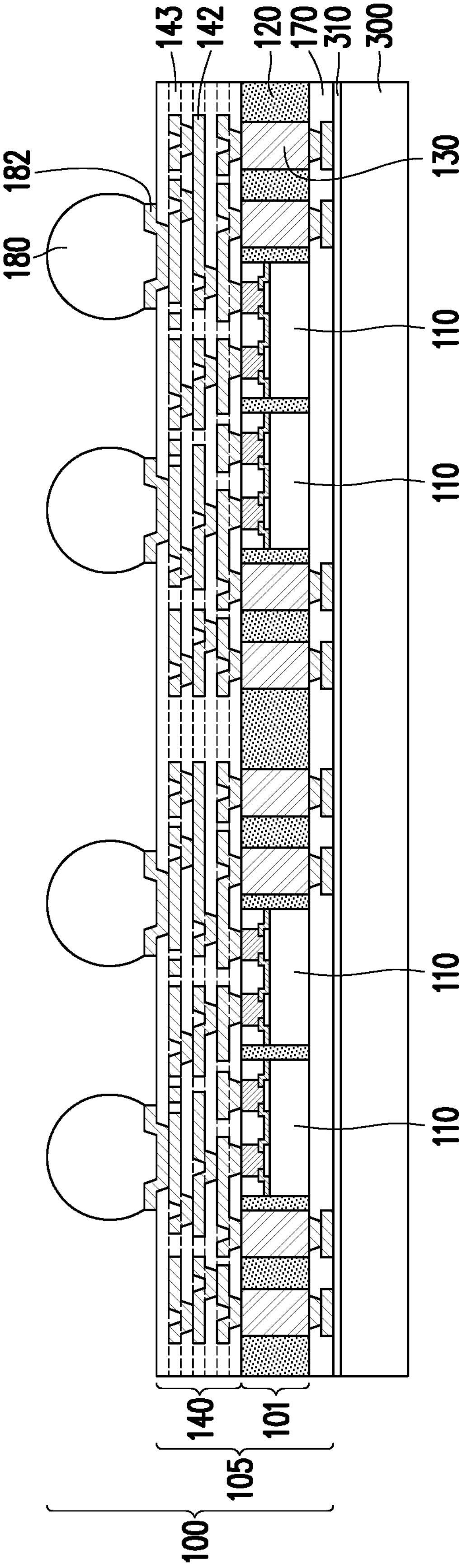

In some embodiments, a first package (e.g. the first package 100 as shown in FIG. 6) may be formed on the carrier substrate 300, or on the adhesive layer 310 (if any). In some embodiments, the first package 100 is an Integrated Fan-Out (InFO) package, although any suitable packages may alternatively be used. In the present embodiment, the first package 100 includes a reconstructed wafer (e.g. the reconstructed wafer 105 as shown in FIG. 6) and a plurality of conductive bumps (e.g. the conductive bumps 180 as shown in FIG. 6) disposed on a first side of the reconstructed wafer. The reconstructed wafer includes a plurality of semiconductor devices 110 encapsulated by an encapsulating material 120. The formation of the first package 100 may include the following steps.

With reference now to FIG. 1, a (second) redistribution structure 170 may be optionally formed on the carrier substrate 300, or on the adhesive layer 310 (if any). In some embodiments, the redistribution structure 170 may include at least one insulating layer. The insulating layer may be placed over the adhesive layer 310 and is utilized in order to provide protection to, e.g., the semiconductor devices 110/110' once the semiconductor devices 110/110' have been attached. In an embodiment, the insulating layer may be polybenzoxazole (PBO), although any suitable material, such as polyimide or a polyimide derivative, may alternatively be utilized. The insulating layer may be placed using, e.g., a spin-coating process to a thickness of between about 2 μm and about 15 μm, such as about 5 μm, although any suitable method and thickness may alternatively be used. In some embodiments, the redistribution structure 170 may further include a circuit layer for electrically connecting the semiconductor devices 110/110' once the semiconductor devices 110/110' have been attached.

Then, a plurality of through vias 130 are provided on the carrier substrate 300, and the through vias 130 surrounds at least one device area where the semiconductor devices 110/110' to be disposed. In the present embodiment, the through vias 130 are formed on and electrically connected to the redistribution structure 170 located on the carrier substrate 300, but the disclosure is not limited thereto. In other embodiments, the through vias 130 may be pre-formed, and are then placed on the carrier substrate 300.

In the embodiment of the through vias 130 formed on the carrier substrate 300, the formation of the through vias 130 may include the following steps. First, a seed layer may be formed over the redistribution structure 170. The seed layer is a thin layer of a conductive material that aids in the formation of a thicker layer during subsequent processing steps. For example, the seed layer may include a layer of titanium about 1,000 Å thick followed by a layer of copper about 5,000 Å thick. The seed layer may be created using processes such as sputtering, evaporation, or PECVD processes, depending upon the desired materials.

Then, a photoresist is formed over the seed layer. In an embodiment, the photoresist may be placed on the seed layer using, e.g. a spin coating technique. Once in place, the photoresist may then be patterned by exposing the photoresist to a patterned energy source (e.g. a patterned light source), thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern. The pattern formed into the photoresist is a pattern for the through vias 130. The through vias 130 are formed in such a placement as to be located on different sides of subsequently attached semiconductor devices 110/110'. In other words, the semiconductor devices 110/110' are surrounded by the through vias 130. However, any suitable arrangement for the pattern of through vias 130 may alternatively be utilized.

Then, the through vias 130 are formed in the photoresist. In an embodiment, the through vias 130 include one or more conductive materials, such as copper, tungsten, other conductive metals, or the like, and may be formed, for example, by electroplating, electroless plating, or the like. In an embodiment, an electroplating process is used for plating the exposed conductive areas of the seed layer within the opening of the photoresist. Once the through vias 130 are formed using the photoresist and the seed layer, the photoresist may be removed using a suitable removal process. In an embodiment, a plasma ashing process may be used to remove the photoresist, whereby the temperature of the photoresist 301 may be increased until the photoresist experiences a thermal decomposition and may be removed. However, any other suitable process, such as a wet strip, may alternatively be utilized. The removal of the photoresist may expose the underlying portions of the seed layer.

Then, the exposed portions of the seed layer (e.g., those portions that are not covered by the through vias 130) may be removed by, for example, a wet or dry etching process. For example, in a dry etching process reactants may be directed towards the seed layer, using the through vias 130 as masks. Alternatively, etchants may be sprayed or otherwise put into contact with the seed layer in order to remove the exposed portions of the seed layer. After the exposed portion of the seed layer has been etched away, a portion of the redistribution structure 170 is exposed between the through vias 130. At this point, the formation of the through vias 130 is substantially done.

Figure 2:
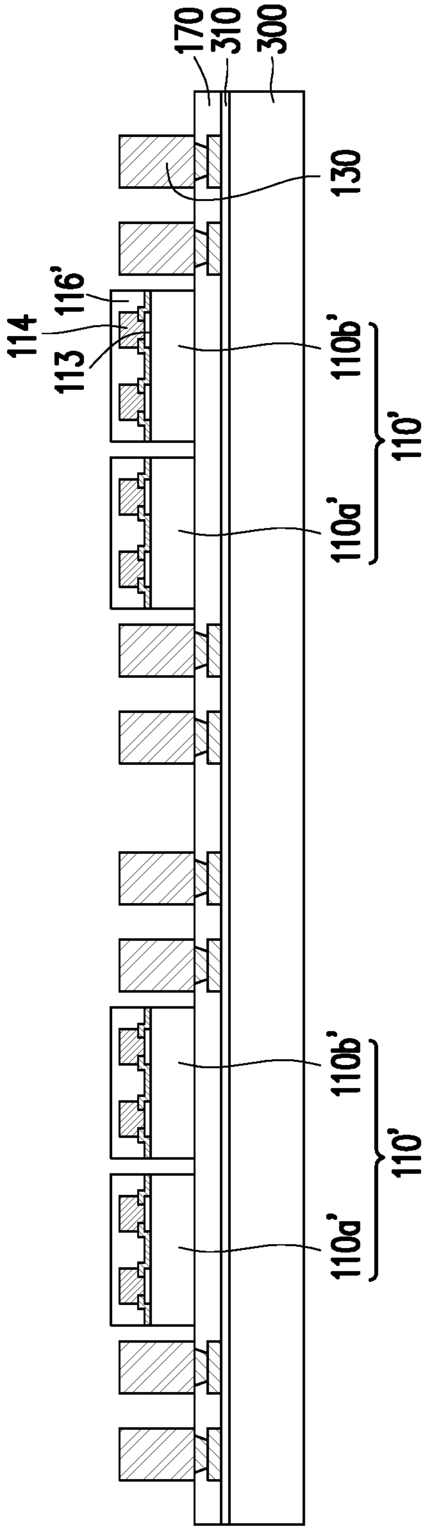

With reference now to FIG. 2, in some embodiments, at least one semiconductor device 110' (a plurality of semiconductor devices 110' are illustrated, but not limited thereto) may be provided on the carrier substrate 300 and within or between the through vias 130. In an embodiment, the semiconductor devices 110' may include at least one semiconductor device set (multiple semiconductor device sets are illustrated, but not limited thereto), and each of the semiconductor device sets may include a first semiconductor device **110*a*' and a second semiconductor device 110*a*'. In each set, the first semiconductor device 110*a*' and the second semiconductor device 110***a*' are electrically connected through, e.g., a (first) redistribution structure 140 (not illustrated in FIG. 2 but illustrated and discussed below with respect to FIG. 5) and may be utilized together in order to provide a desired functionality to an end user. In an embodiment the first semiconductor device 110*a*' and the second semiconductor device 110*b*' may be attached to the carrier substrate 300 (or the redistribution structure 170) using, e.g. an adhesive material, although any suitable method of attachment may alternatively be utilized. The through vias 130 may surround each set of the semiconductor devices 110'. With such arrangement, a plurality of package on package structures can be formed concurrently for batch production. For the sake of brevity and clarity, the following manufacturing process are described regarding one of the package on package structures.

In some embodiments, the semiconductor devices 110' may be logic device dies including logic circuits therein. In some exemplary embodiments, the semiconductor devices 110' are dies that are designed for mobile applications, and may include a Power Management Integrated Circuit (PMIC) die and a Transceiver (TRX) die, for example. It is noted that more or less semiconductor devices 110' may be placed over the carrier substrate 300 and level with one another.

In some exemplary embodiments, each of the semiconductor devices 110' may include a substrate 112, a plurality of active devices (not shown), a plurality of contact pads 113, at least one dielectric layer 116', and a plurality of conductive vias 114. The conductive vias 114 (such as copper vias) may be formed on an active surface (e.g. the top surface) of the semiconductor devices 110' and electrically coupled to the contact pads 113 on the substrate 112. The substrate 112 may include bulk silicon, doped or undoped, or an active layer of a silicon-on-insulator (SOI) substrate. Generally, an SOI substrate includes a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. The active devices includes a wide variety of active devices and passive devices such as capacitors, resistors, inductors and the like that may be used to generate the desired structural and functional requirements of the design for the semiconductor devices 110'. The active devices may be formed using any suitable methods either within or else on the substrate 112.

In some embodiments, the dielectric layer 116' may be formed on the active surface of the semiconductor devices 110', and may cover the top surfaces of the conductive vias 114. In other embodiments, the top surface of the dielectric layer 116' may be substantially level with the top surfaces of the conductive vias 114. Alternatively, the dielectric layer 116' may be omitted, and the conductive vias 114 protrude from the active surface of the semiconductor devices 110'. The dielectric layer 116' may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The dielectric layer 116' may be formed through a process such as chemical vapor deposition (CVD), although any suitable process may be utilized.

In some embodiments, the top ends of the through vias 130 may be substantially level with the top surfaces of the conductive vias 114. In other embodiments, the top ends of the through vias 130 may be substantially higher than the top surfaces of the conductive vias 114. Alternatively, the top ends of the through vias 130 may be substantially lower than the top surfaces of the conductive vias 114 but substantially higher than the bottom surfaces of the conductive vias 114.

Figure 3:
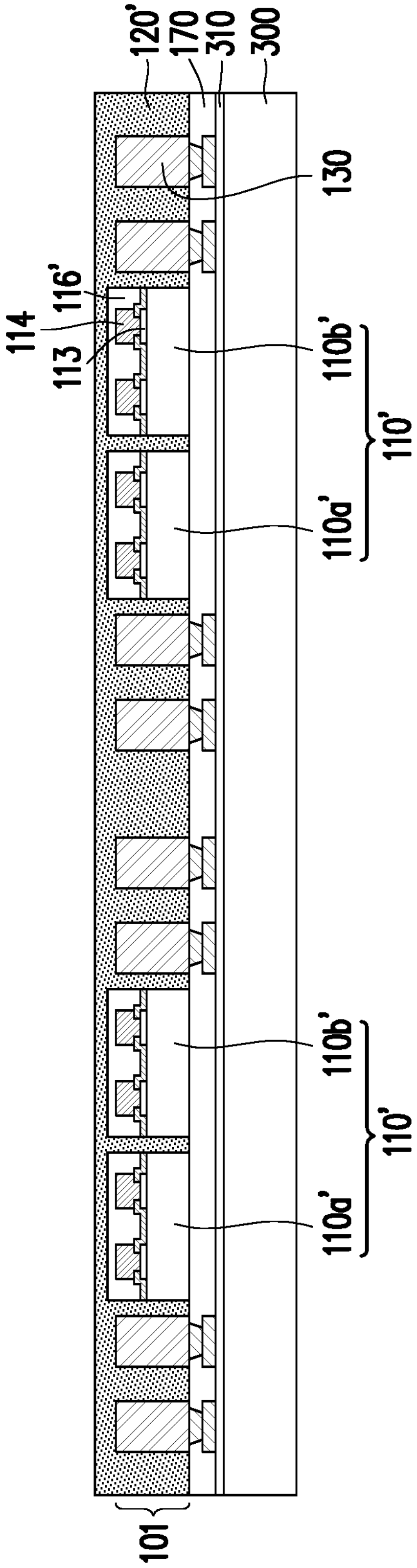

With reference now to FIG. 3, in some embodiments, the semiconductor devices 110' and the through vias 130 on the carrier substrate 300 are encapsulated by an encapsulating material 120'. In other words, the encapsulating material 120' is formed on the carrier substrate 300 to encapsulate the through vias 130 and the semiconductor devices 110'. In some embodiments, the encapsulating material 120' fills the gaps between the semiconductor devices 110' and the through vias 130, and may be in contact with the redistribution structure 170. The encapsulating material 120' may include a molding compound resin such as polyimide, PPS, PEEK, PES, a heat resistant crystal resin, combinations of these, or the like. The encapsulation of the semiconductor devices 110' and the through vias 130 may be performed in a molding device (not individually illustrated in FIG. 3). The encapsulating material 120' may be placed within a molding cavity of the molding device, or else may be injected into the molding cavity through an injection port.

Once the encapsulating material 120' has been placed into the molding cavity such that the encapsulating material 120' encapsulates the carrier substrate 300, the semiconductor devices 110' and the through vias 130, the encapsulating material 120' may be cured in order to harden the encapsulating material 120' for optimum protection. Additionally, initiators and/or catalysts may be included within the encapsulating material 120' to better control the curing process. In some embodiments, a top surface of the encapsulating material 120' may be higher than the top ends of the through vias 130 and the top surface of the dielectric layer 116'. Namely, the encapsulating material 120' covers the top ends of the through vias 130 and the top surface of the dielectric layer 116'.

Figure 4:
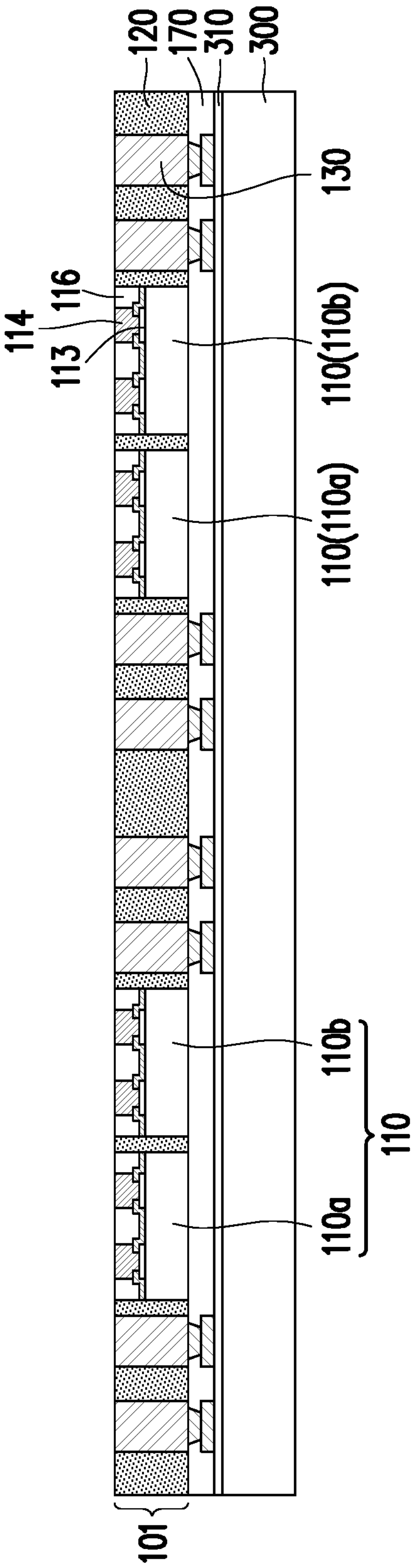

With reference now to FIG. 4, a thinning process may be performed on the encapsulating material 120' (and the dielectric layer 116') to reveal the top ends of the through vias 130 and the top surfaces of the conductive vias 114 for further processing. The thinning process may be, for example, a mechanical grinding or CMP process whereby chemical etchants and abrasives are utilized to react and grind away the encapsulating material 120', the semiconductor device 110' until the through vias 130, the conductive vias 114 have been revealed. The resulting structure is shown in FIG. 4. After the thinning process is performed, the top ends of the through vias 130 are substantially level with the top surfaces of the conductive vias 114, and are substantially level with the top surface of the encapsulating material 120 and the top surface of the dielectric layer 116 as shown in FIG. 4. However, while the CMP process described above is presented as one illustrative embodiment, it is not intended to be limiting to the embodiments. Any other suitable removal process may alternatively be used to thin the encapsulating material 120, the semiconductor device 110 and expose the through vias 130. For example, a series of chemical etches may alternatively be utilized. This process and any other suitable process may alternatively be utilized to thin the encapsulating material 120, the semiconductor device 110 and the through vias 130, and all such processes are fully intended to be included within the scope of the embodiments.

Throughout the description, the resultant structure including the semiconductor devices 110 (including the first semiconductor devices 110*a* and second semiconductor devices 110*b* as shown in FIG. 4), the through vias 130 and the encapsulating material 120 as shown in FIG. 4 is referred to as encapsulated semiconductor device 101, which may have a wafer form in the process. Accordingly, in the encapsulated semiconductor device 101, the semiconductor devices 110 are disposed at the die area, the through vias 130 extend through the encapsulated semiconductor device 101 outside of the die area, and the encapsulating material 120 encapsulates the semiconductor devices 110 and the through vias 130. In other words, the encapsulating material 120 encapsulates the semiconductor devices 110 therein, and the through vias 130 extends through the encapsulating material 120.

Figure 5:
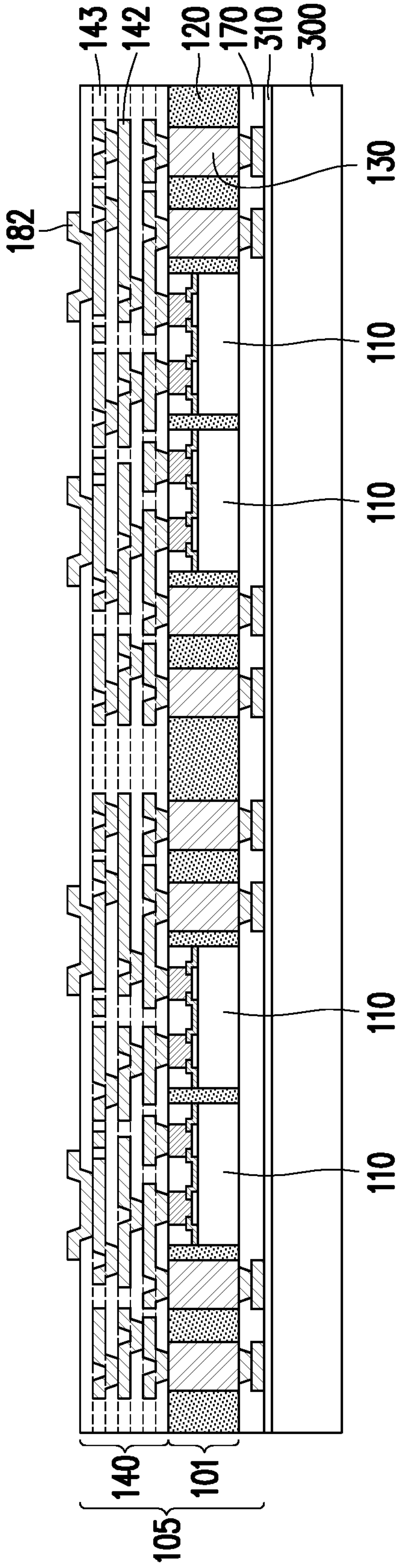

With reference now to FIG. 5, a first redistribution structure 140 is formed on a first side of the encapsulated semiconductor device 101. The first redistribution structure 140 is electrically connected to the semiconductor devices 110 and the through vias 130. In some embodiments, the first redistribution structure 140 are formed over the encapsulated semiconductor device 101 (including the encapsulating material 120 and the semiconductor devices 110) to connect to the conductive vias 114 of the semiconductor devices 110 and the through vias 130. In some embodiments, the first redistribution structure 140 may also interconnect the conductive vias 114 and the through vias 130. The first redistribution structure 140 may be formed by, for example, depositing conductive layers, patterning the conductive layers to form redistribution circuits 142, partially covering the redistribution circuits 142 and filling the gaps between the redistribution circuits 142 with dielectric layers 143, etc. The material of the redistribution circuits 142 may include a metal or a metal alloy including aluminum, copper, tungsten, and/or alloys thereof. The dielectric layers 143 may be formed of dielectric materials such as oxides, nitrides, carbides, carbon nitrides, combinations thereof, and/or multi-layers thereof. The redistribution circuits 142 are formed in the dielectric layers 143 and electrically connected to the device die 110 and the through vias 130. In the embodiment of the encapsulated semiconductor device 101 provided on the redistribution structure 170, the second redistribution structure 170 is located on a second side of the encapsulated semiconductor device 101 opposite to the first side where the first redistribution structure 140 is disposed. Namely, the first redistribution structure 140 and the second redistribution structure 170 are respectively disposed on two opposite sides of the encapsulated semiconductor device 101.

Throughout the description, the resultant structure including the first redistribution structure 140, the encapsulated semiconductor device 101 (and the second redistribution structure 170) as shown in FIG. 5 is referred to as a reconstructed wafer 105, which has a wafer form in the process.

With reference now to FIG. 6, a plurality of conductive bumps 180 are disposed on the first redistribution structure 140. In other words, the conductive bumps 180 are disposed on a side of the reconstructed wafer 105. In some embodiments, an Under Bump Metallurgy (UBM) layer 182 may be formed on the first redistribution structure 140 by sputtering, evaporation, or electroless plating, etc., and the conductive bumps 180 may be disposed on the UBM layer 182. In some embodiments, at least one Integrated Passive Device (IPD) may also be disposed on the first redistribution structure 140 in accordance with some exemplary embodiments. The formation of the conductive bumps 180 may include placing solder balls on the UBM layer 182 (or on the first redistribution structure 140), and then reflowing the solder balls. In alternative embodiments, the formation of the conductive bumps 180 may include performing a plating process to form solder regions on the UBM layer 182 (or on the first redistribution structure 140), and then reflowing the solder regions. The IPD may be fabricated using standard wafer fabrication technologies such as thin film and photolithography processing, and may be mounted on the UBM layer 182 (or on the first redistribution structure 140) through, for example, flip-chip bonding or wire bonding, etc.

Throughout the description, the resultant structure including the first redistribution structure 140, the encapsulated semiconductor device 101, the second redistribution structure 170, and the conductive bumps 180 as shown in FIG. 6 is referred to as the first package 100, which may have a wafer form in the process.

Figure 7:
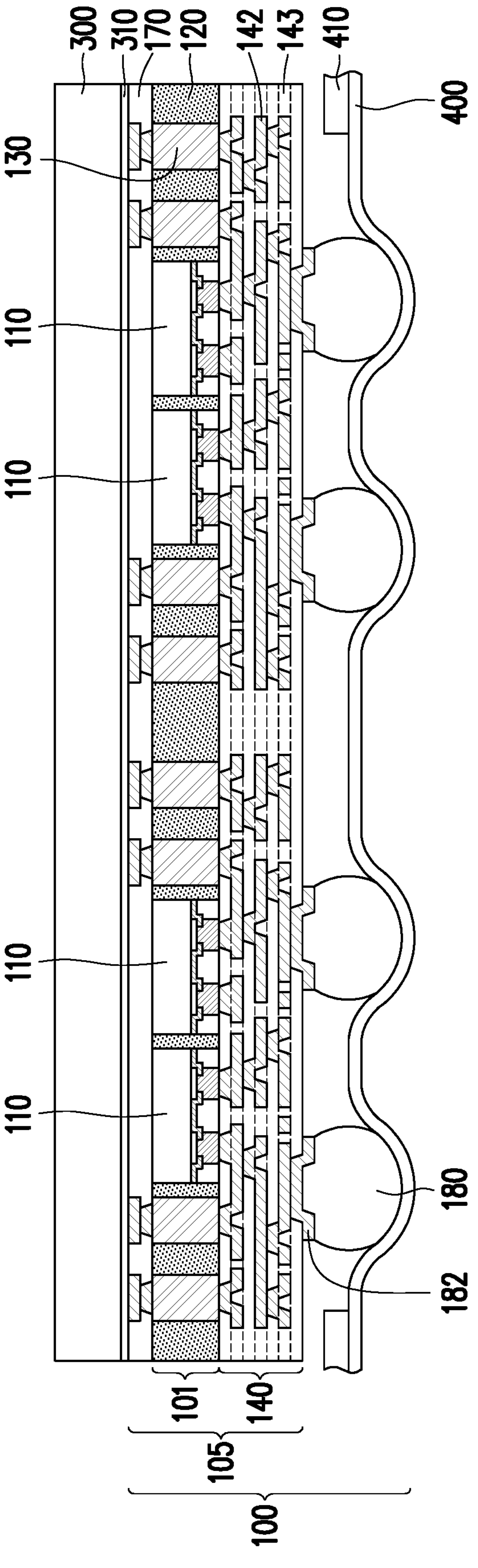
Figure 14:
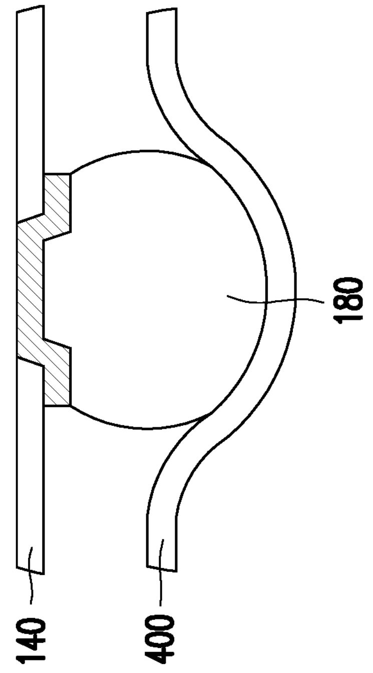
FIG. 14 illustrates a cross sectional view of a conductive bump of a package on package structure according to some exemplary embodiments of the present disclosure.

FIG. 14 illustrates a cross sectional view of a conductive bump of a package on package structure according to some exemplary embodiments of the present disclosure. With reference now to FIG. 7 and FIG. 14, after the first package 100 is formed on the carrier substrate 300, the first package 100 with the carrier substrate 300 may be flipped over and disposed on a tape carrier 400 by attaching the conductive bumps 180 to the tape carrier 400. The tape carrier 400 bearing first package 100 with the carrier substrate 300 may further include a frame structure 410, which may be a metal ring intended to provide support and stability for the structure during the sequential process. In some embodiments, the tape carrier 400 is made of, for example, polymer material with flexibility. In one embodiment, a young's modulus of the tape carrier 400 is substantially smaller than 10 Mpa, and a glass transition temperature (Tg) of the tape carrier 400 is substantially smaller than a room temperature. Namely, when the tape carrier 400 is used at or above the room temperature, the tape carrier 400 is in a rubbery state, where the tape carrier 400 is soft and flexible. Accordingly, when the conductive bumps 180 are attached to the tape carrier 400, the tape carrier 400 is deformed and embraces at least a lower portion of each of the conductive bumps 180 as it is shown in FIG. 14.

Figure 8:
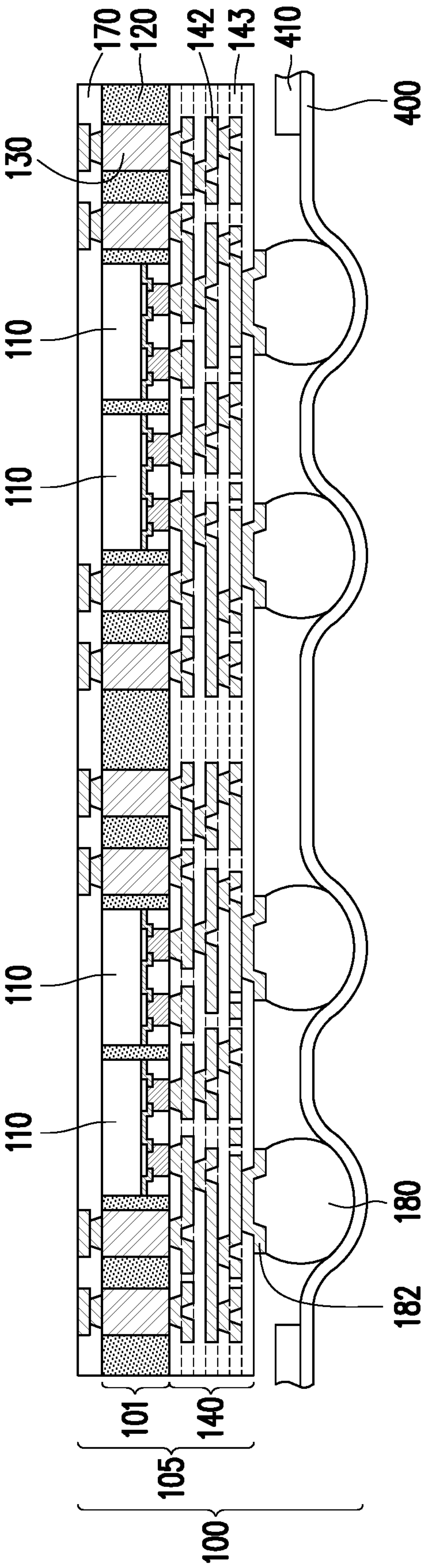

With reference now to FIG. 7 and FIG. 8, the carrier substrate 300 is de-bonded from the first package 100 on the tape carrier 400. The carrier substrate 300 may be de-bonded using, for example, a thermal process to alter the adhesive properties of the adhesive layer 310. In an embodiment, an energy source such as an ultraviolet (UV) laser, a carbon dioxide ($CO_2$) laser, or an infrared (IR) laser, is utilized to irradiate and heat the adhesive layer 310 until the adhesive layer 310 loses at least some of its adhesive properties. Once performed, the carrier substrate 300 and the adhesive layer 310 may be physically separated and removed from the first package 100 as it is shown in FIG. 8.

After the carrier substrate 300 is de-bonded, the second redistribution structure 170 may be revealed. In the embodiments of the second redistribution structure 170 being omitted, a grinding process may be performed to lightly grind the encapsulating material 120, the back surface of semiconductor device 110 and the bottom ends of the through vias 130. In other embodiments, the grinding process may be skipped.

Figure 9:
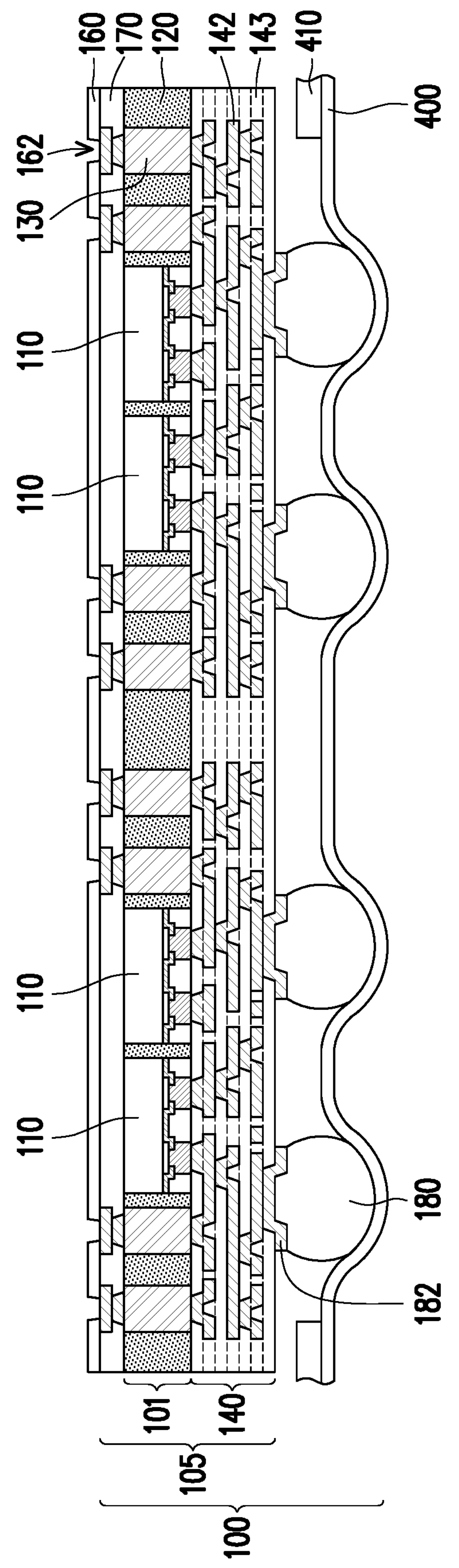

With reference now to FIG. 9, in some embodiments, a patterned dielectric layer 160 may be formed on the reconstructed wafer 105 in order to provide protection and isolation for the second redistribution structure 170 and the other underlying structures. In an embodiment, the patterned dielectric layer 160 may be polybenzoxazole (PBO), although any suitable material, such as polyimide or a polyimide derivative may alternatively be utilized. The patterned dielectric layer 160 may be formed by placing a dielectric layer using, e.g. a spin-coating process, and then patterning the dielectric layer to form a plurality of openings 162 revealing a plurality of electrical contacts of the reconstructed wafer 105 (e.g. electrical contacts 172 of the second redistribution structure 170). The openings 162 may be formed using a suitable photolithographic mask and etching process, although any suitable process may be used.

Figure 10:
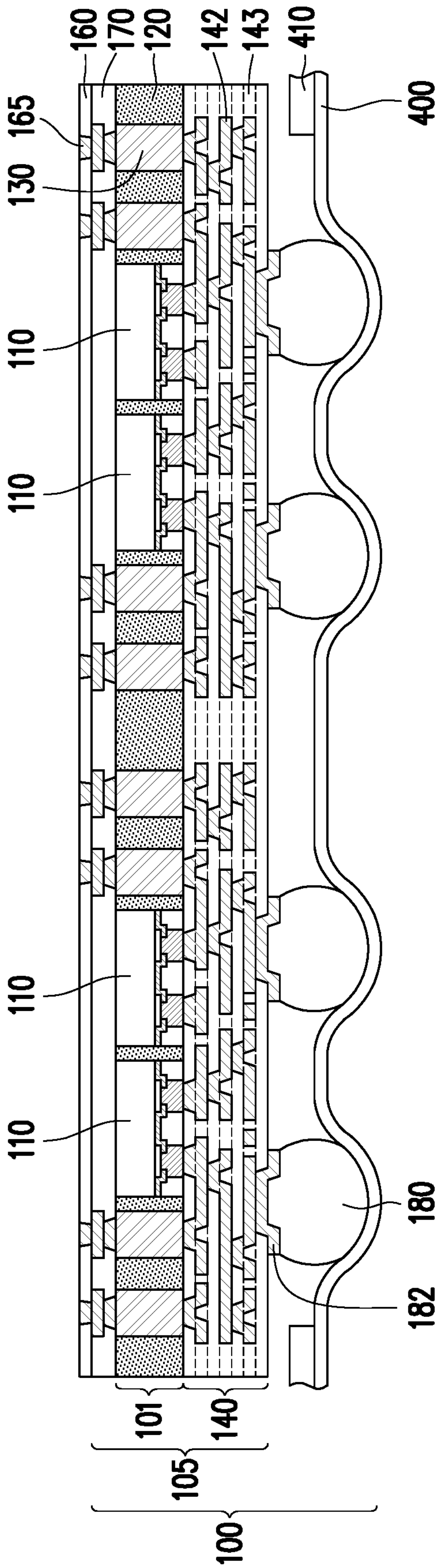

With reference now to FIG. 9 and FIG. 10, in some embodiments, a plurality of solder materials 165 are formed in the openings 162. In some embodiments, the solder materials 165 are formed using a screen printing process. For example, a screen frame is placed over the printing surface (e.g. the second redistribution structure 170) and the solder materials 165 is deposited onto the screen frame. Then, a flexible squeegee, or the like, may be driven across the screen frame to push the solder materials 165 through openings of the screen frame. However, any suitable process to provide the solder materials 165 in the openings 162 may be used.

Figure 11:
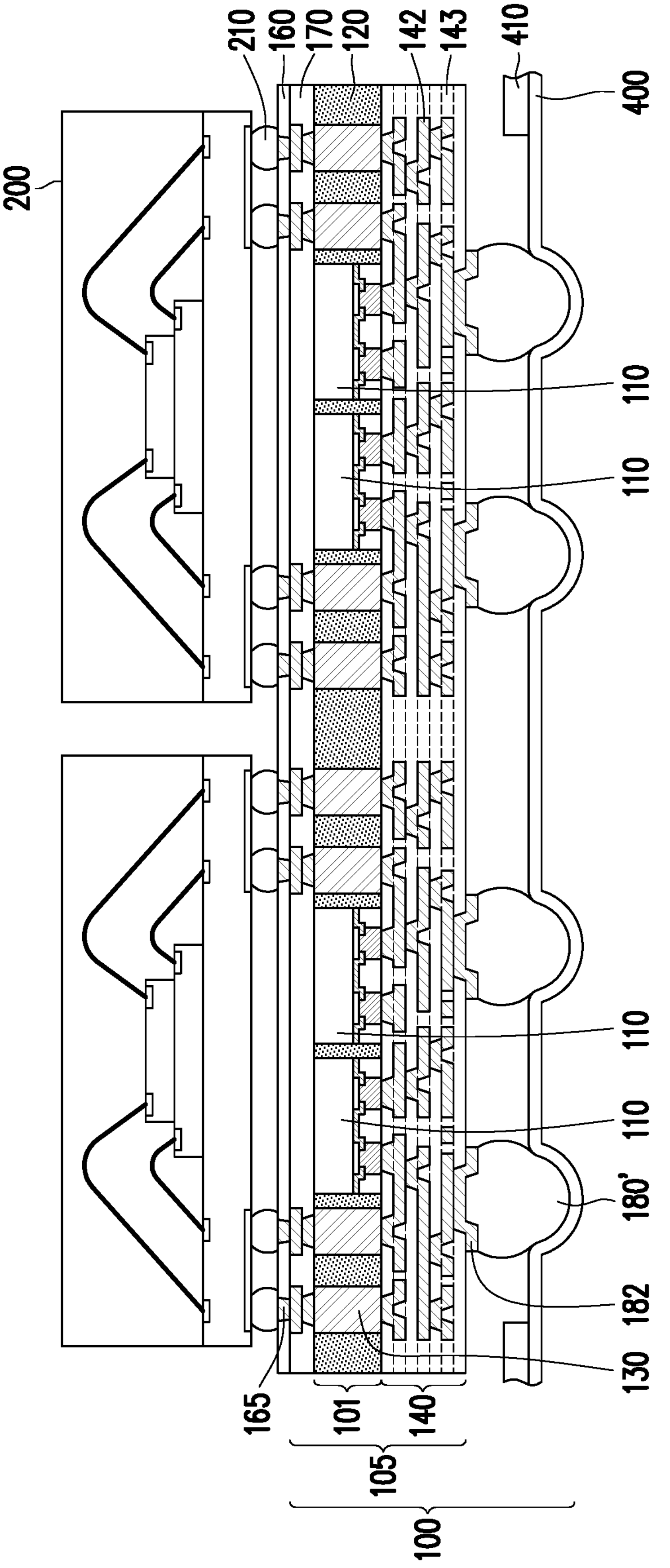

With reference now to FIG. 11, at least one second package 200 (multiple second packages 200 are illustrated herein) is mounted on the first package 100 through a plurality of electrical terminals 210. In an embodiment, the second packages 200 are used to work in conjunction with the first semiconductor devices 110 (including the first semiconductor devices 110*a* and the second semiconductor devices 110*b* as shown in FIG. 4) respectively in order to provide the desired functionality to the end user. In the embodiment of the first package 100 having one set of the semiconductor devices 110 therein (e.g. including one first semiconductor device 110*a* and one second semiconductor devices 110*b*), one second package 200 may be mounted on the first package 100.

In an embodiment, the second package 200 may include a semiconductor device such as a memory device that may be used to provide stored data to the semiconductor device 110. In such an embodiment, the semiconductor device 110 may include a memory control module (not illustrated) that provides a control functionality to the memory device of the second package 200 in addition to other functionalities provided by the semiconductor device 110. However, in other embodiments, the second package 200 may include its own memory control module.

In some embodiments, the second packages 200 are mounted on the first package 100 by initially aligning the electrical terminals 210 with the openings of the patterned dielectric layer 160 and placing the electrical terminals 210 in physical contact with the solder materials 165. Thereby, the second packages 200 are electrically connected to the solder material 165. Once in contact, the electrical terminals 210 may be bonded to the first package 100 using a process such as a thermo-compression bonding process. Any suitable method of bonding may alternatively be utilized to bond the second packages 200 to the first package 100. With the high temperature of the thermo-compression bonding process (including reflowing process) while pressing the conductive bumps 180 against the tape carrier 400 with flexibility, the conductive bumps 180 are deformed into a plurality of deformed conductive bumps 180' as shown in FIG. 11.

Throughout the description, the resultant structure including the first package in a wafer form 100 and the second packages 200 mounted thereon as shown in FIG. 11 is referred to as a package on wafer structure 10', which have a wafer form in the process.

Figure 15:
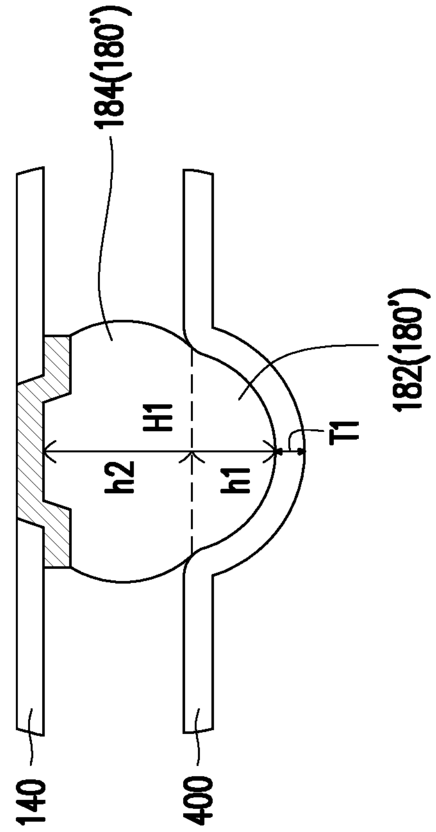
FIG. 15 illustrates a cross sectional view of a deformed conductive bump of a package on package structure according to some exemplary embodiments of the present disclosure.
Figure 16:
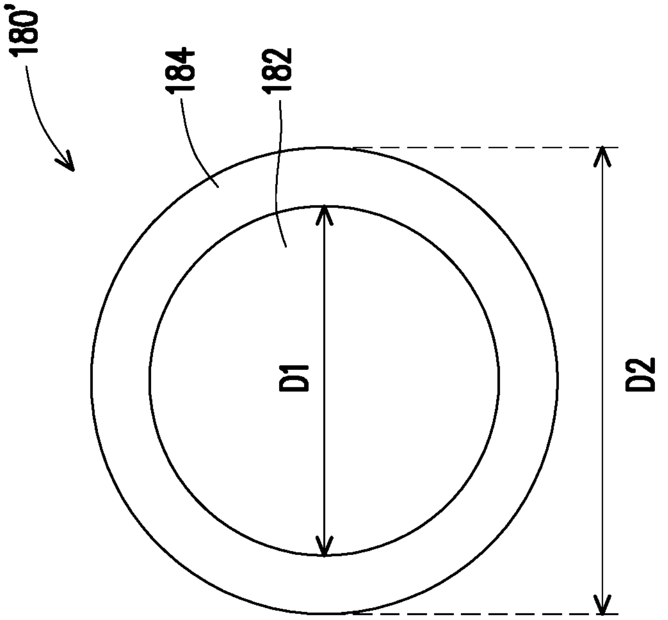
FIG. 16 illustrates a schematic top view of a deformed conductive bump of a package on package structure according to some exemplary embodiments of the present disclosure.

FIG. 15 illustrates a cross sectional view of a deformed conductive bump of a package on package structure according to some exemplary embodiments of the present disclosure. FIG. 16 illustrates a schematic top view of a deformed conductive bump of a package on package structure according to some exemplary embodiments of the present disclosure. With reference now to FIG. 15 and FIG. 16, in some embodiments, each of the deformed conductive bumps 180' includes a tip portion 182 and a base portion 184. The base portion 184 is connected to the first redistribution structure 140, and the tip portion 182 is connected to the base portion 184. The tip portion 182 and the base portion 184 are directly connected to each other and integrally formed.

Due to the embracement of the tape carrier 400 under high temperature, the tip of the conductive bump contacting the tape portion 400 is squeezed and deformed into the tip portion 182. Accordingly, a curvature of the base portion 184 is different from a curvature of the tip portion 182. In other words, each of the deformed conductive bumps 180' undergoes a curvature change between the tip portion 182 and the base portion 184. This curvature change can be a gradual change, but, in other embodiments, the curvature change can be a sharper change. From a top view of the deformed conductive bump 180' shown in FIG. 16, it can be seen that the deformed conductive bump 180' is not in a uniform dome shape. To achieve the deformation, a thickness T1 of the tape carrier 400 is substantially greater than 20% of a height H1 of each deformed conductive bump 180', and the thickness T1 of the tape carrier 400 is substantially smaller than 80% of the height H1 of each deformed conductive bump 180', i.e. 20% H1<T1<80% H1. In some embodiments, a ratio of the thickness T1 of the tape carrier 400 to a height h1 of the tip portion 182 may substantially range from 50% to 150%. In some embodiments, the height h1 of the tip portion 182 is substantially smaller than a height h2 of the base portion 184.

In some embodiments, a curvature of the base portion 184 is substantially smaller than a curvature of the tip portion 182. Geometrically, the curvature measures how fast the unit tangent vector to the curve rotates. That is to say, in some embodiments, the unit tangent vector to the curve of the base portion 184 changes slightly less than that of the tip portion 182. In other words, the curve of the tip portion 182 may undergo a tighter turn. In some embodiments, a maximum diameter D1 of the tip portion 182 is substantially smaller than a maximum diameter D2 of the base portion 184. For example, a ratio of the maximum diameter D1 of the tip portion 182 to the maximum diameter D2 of the base portion 184 (i.e. D1/D2) substantially ranges from 50% to 90%.

Owing to the deformation of the deformed conductive bump 180', a contact area between the tape carrier 400 and the deformed conductive bump 180' is increased, so the bonding strength between the tape carrier 400 and the deformed conductive bump 180' can be improved. Accordingly, the first package 100 can be fixed onto the tape carrier 400 in a more firm and stable manner, so as to improve yield rate of bonding process performed on the package on wafer structure 10'. In addition, the tape carrier 400 provides reliable protection to the deformed conductive bump 180' by embracing at least a part of the deformed conductive bump 180' during the bonding process and subsequent process such as singularizing process.

Figure 12:
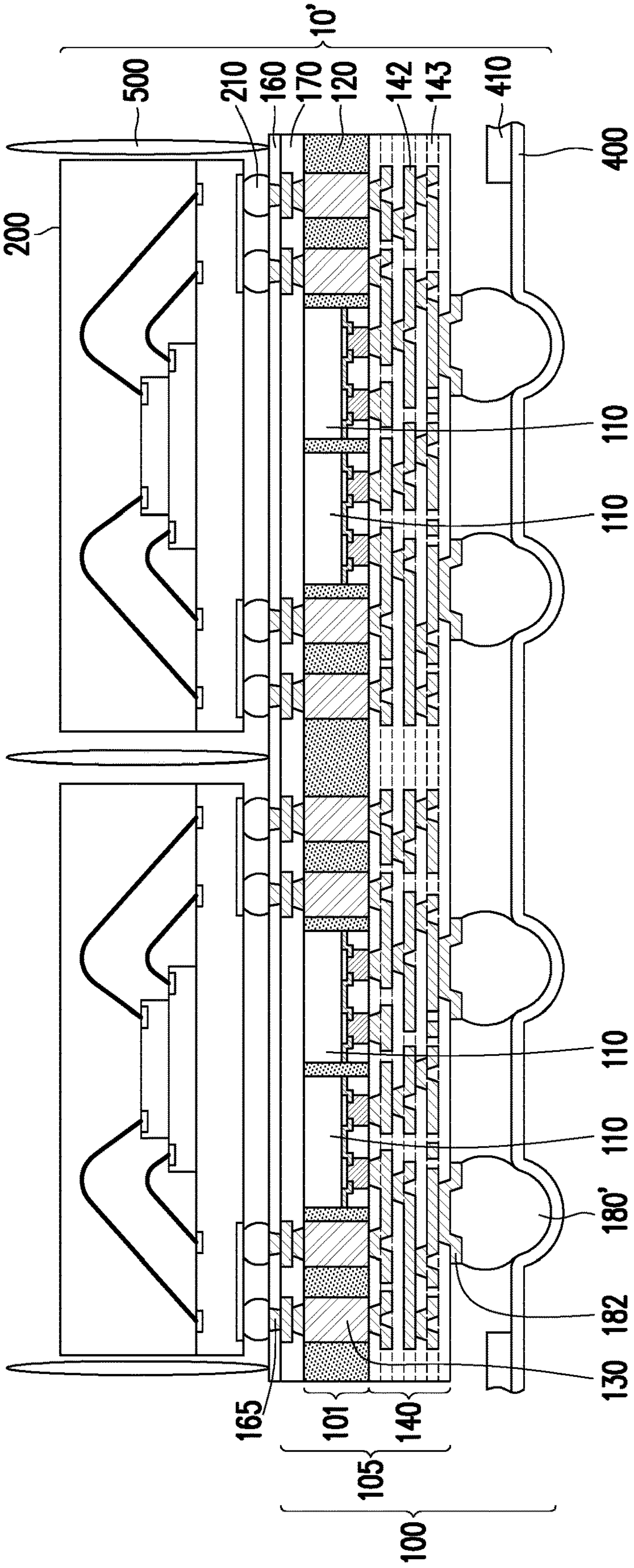

With reference now to FIG. 12, a singularizing process is performed to the package on wafer structure 10' on the tape carrier 400 to form a plurality of package on package structures 10 independent from one another. Accordingly, each of the singularized first package may include one of the first semiconductor devices 110*a* and one of the second semiconductor devices 110*b*. In an embodiment, the singularizing process may be performed by using a saw blade 500 to slice through the reconstructed wafer 105 of the first package 100. Thereby, one section (e.g. include one of the first semiconductor devices 110*a* and one of the second semiconductor devices 110*b*) of the first package100 is separated from another to form a plurality of package on package structures 10. Each of the package on package structures 10 includes a first package 100' with the second package 200 bonded to the first package 100'.

However, as one of ordinary skill in the art will recognize, utilizing a saw blade to singularize the package on wafer structure 10' is merely one illustrative embodiment and is not intended to be limiting. Alternative methods for singularizing the package on wafer structure 10', such as utilizing one or more etches to separate the package on wafer structure 10' and form the package on package structures 10, may alternatively be utilized. These methods and any other suitable methods may alternatively be utilized for singularizing process.

With reference now to FIG. 13, the plurality of package on package structures 10 are separated from the tape carrier 400 by an apparatus including a plurality of poker pins 600 poking under the tape carrier 400. In some embodiments, each of the poker pins 600 lies in a plane common to the remaining poker pins 600. The plurality of package on package structures 10 along with the tape carrier 400 are placed on the apparatus, so the poker pins 600 are configured to poke on the back surface of the tape carrier 400. In one of the implementations, vacuum conditions may be created between the poker pins 600, and pulls at least portions of tape carrier 400 toward the poker pins 600 and thus reduce the contact area between the package on package structures 10 and the tape carrier 400. In some embodiments, the removal process may be facilitated by the application of heat to at least the tape carrier 400 such that the adherent forces between the package on package structures 10 and the tape carrier 400 are further reduced.

With such arrangement, in the manufacturing process of the package on package structure 10, the de-bonding process for de-bonding the carrier substrate 300, the bonding and reflowing process for mounting the second package 200 onto the first package 100, and the singularizing process are all performed on the tape carrier 400. Thereby, manufacturing process can be simplified, production cost can be reduced, and the productivity of the package on package structure 10 can be improved. In addition, by performing the bonding and reflowing process on the tape carrier 400, causing deformation of the deformed conductive bump 180', the bonding strength between the tape carrier 400 and the deformed conductive bump 180' is improved. Accordingly, yield rate of bonding process performed on the package on wafer structure 10' is also improved. Moreover, the tape carrier 400 provides reliable protection to the deformed conductive bump 180' by embracing at least a part of the deformed conductive bump 180'.

Based on the above discussions, it can be seen that the present disclosure offers various advantages. It is understood, however, that not all advantages are necessarily discussed herein, other embodiments may offer different advantages, and that no particular advantage is required for all embodiments.

In accordance with some embodiments of the disclosure, a manufacturing method of a package on package structure includes the following steps. A first package is provided on a tape carrier, wherein the first package includes an encapsulated semiconductor device, a first redistribution structure disposed on a first side of the encapsulated semiconductor device, and a plurality of conductive bumps disposed on the first redistribution structure and attached to the tape carrier. A second package is mounted on the first package through a plurality of electrical terminals by a thermo-compression bonding process, which deforms the conductive bumps into a plurality of deformed conductive bumps. Each of the deformed conductive bumps comprises a base portion connecting the first redistribution structure and a tip portion connecting the base portion, and a curvature of the base portion is substantially smaller than a curvature of the tip portion.

In accordance with some embodiments of the disclosure, a manufacturing method of a package on package structure includes the following steps. A first package is provided on a tape carrier, wherein the first package comprises a reconstructed wafer and a plurality of conductive bumps disposed on a first side of the reconstructed wafer and attached to the tape carrier, and the reconstructed wafer comprising a plurality of semiconductor devices encapsulated by an encapsulating material. A plurality of second packages are mounted on a second side of the reconstructed wafer through a plurality of electrical terminals by a thermo-compression bonding process, which deforms the conductive bumps into a plurality of deformed conductive bumps. Each of the deformed conductive bumps comprises a base portion connecting the reconstructed wafer and a tip portion connecting the base portion, and a curvature of the base portion is substantially smaller than a curvature of the tip portion.

In accordance with some embodiments of the disclosure, a manufacturing method of a package on package structure includes the following steps. A first package is formed on a carrier substrate, wherein the first package comprises a reconstructed wafer and a plurality of conductive bumps disposed on a first side of the reconstructed wafer, and the reconstructed wafer comprising a plurality of semiconductor devices encapsulated by an encapsulating material. The first package with the carrier substrate is disposed on a tape carrier. The carrier substrate is de-bonded from the first package on the tape carrier. A plurality of second packages are mounted on a second side of the reconstructed wafer to form a package on wafer structure by a thermo-compression bonding process, which deforms the conductive bumps into a plurality of deformed conductive bumps through pressing the conductive bumps against the tape carrier. Each of the deformed conductive bumps comprises a base portion and a tip portion, and a curvature of the base portion is different from a curvature of the tip portion. A singularizing process is performed to the package on wafer structure on the tape carrier to form a plurality of package on package structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a package on package structure, comprising:

providing a first package on a tape carrier, wherein the first package comprises an encapsulated semiconductor device, a first redistribution structure disposed on a first side of the encapsulated semiconductor device, and a plurality of conductive bumps disposed on the first redistribution structure and attached to the tape carrier; and mounting a second package on the first package through a plurality of electrical terminals by a thermo-compression bonding process, which deforms the conductive bumps into a plurality of deformed conductive bumps, wherein each of the deformed conductive bumps comprises a base portion connecting the first redistribution structure and a tip portion connecting the base portion, and a curvature of the base portion is substantially smaller than a curvature of the tip portion.

2. The manufacturing method of the package on package structure as claimed in claim 1, wherein a maximum diameter of the tip portion is substantially smaller than a maximum diameter of the base portion.

3. The manufacturing method of the package on package structure as claimed in claim 1, wherein a ratio of a maximum diameter of the tip portion to a maximum diameter of the base portion substantially ranges from 50% to 90%.

4. The manufacturing method of the package on package structure as claimed in claim 1, wherein a thickness of the tape carrier is substantially greater than 20% of a height of each of the deformed conductive bumps and is substantially smaller than 80% of the height of each of the deformed conductive bumps.

5. The manufacturing method of the package on package structure as claimed in claim 1, wherein the method of providing the encapsulated semiconductor device comprises:

providing a plurality of through vias;

providing a semiconductor device, wherein the semiconductor device is surrounded by the through vias; and encapsulating the semiconductor device and the through vias by an encapsulating material.

6. The manufacturing method of the package on package structure as claimed in claim 1, wherein the encapsulated semiconductor device is provided on a second redistribution structure, and the second redistribution structure is on a second side of the encapsulated semiconductor device opposite to the first side.

7. The manufacturing method of the package on package structure as claimed in claim 6, further comprising:

forming a patterned dielectric layer on the encapsulated semiconductor device, wherein the patterned dielectric layer comprising a plurality of openings revealing a plurality of electrical contacts of encapsulated semiconductor device; and forming a plurality of solder materials in the openings, and the second package is mounted on the patterned dielectric layer and electrically connected to the solder materials.

8. A manufacturing method of a package on package structure, comprising:

providing a first package on a tape carrier, wherein the first package comprises a reconstructed wafer and a plurality of conductive bumps disposed on a first side of the reconstructed wafer and attached to the tape carrier, and the reconstructed wafer comprising a plurality of semiconductor devices encapsulated by an encapsulating material; and mounting a plurality of second packages on a second side of the reconstructed wafer through a plurality of electrical terminals by a thermo-compression bonding process, which deforms the conductive bumps into a plurality of deformed conductive bumps, wherein each of the deformed conductive bumps comprises a base portion connecting the reconstructed wafer and a tip portion connecting the base portion, and a curvature of the base portion is substantially smaller than a curvature of the tip portion.

9. The manufacturing method of the package on package structure as claimed in claim 8, wherein a maximum diameter of the tip portion is substantially smaller than a maximum diameter of the base portion.

10. The manufacturing method of the package on package structure as claimed in claim 8, wherein a ratio of a maximum diameter of the tip portion to a maximum diameter of the base portion substantially ranges from 50% to 90%.

11. The manufacturing method of the package on package structure as claimed in claim 8, wherein a young's modulus of the tape carrier is substantially smaller than 10 Mpa.

12. The manufacturing method of the package on package structure as claimed in claim 8, wherein method of forming the reconstructed wafer comprises:

providing a plurality of through vias;

providing the plurality of semiconductor devices, wherein the semiconductor devices are surrounded by the through vias;

encapsulating the plurality of semiconductor devices and the through vias by the encapsulating material; and forming a first redistribution structure on the first side of the reconstructed wafer, wherein the first redistribution structure is extended over the encapsulating material and the plurality of semiconductor devices.

13. The manufacturing method of the package on package structure as claimed in claim 8, wherein the encapsulated semiconductor device is provided on a second redistribution structure, and the second redistribution structure is on a second side of the encapsulated semiconductor device opposite to the first side.

14. The manufacturing method of the package on package structure as claimed in claim 8, further comprising:

forming a patterned dielectric layer on the encapsulated semiconductor device, wherein the patterned dielectric layer comprising a plurality of openings revealing a plurality of electrical contacts of the encapsulated semiconductor device; and forming a plurality of solder materials in the openings, and the second package is mounted on the patterned dielectric layer and electrically connected to the solder materials.

15. A manufacturing method of a package on package structure, comprising:

forming a first package on a carrier substrate, wherein the first package comprises a reconstructed wafer and a plurality of conductive bumps disposed on a first side of the reconstructed wafer, and the reconstructed wafer comprising a plurality of semiconductor devices encapsulated by an encapsulating material;

disposing the first package with the carrier substrate on a tape carrier;

de-bonding the carrier substrate from the first package on the tape carrier;

mounting a plurality of second packages on a second side of the reconstructed wafer to form a package on wafer structure by a thermo-compression bonding process, which deforms the conductive bumps into a plurality of deformed conductive bumps through pressing the conductive bumps against the tape carrier, wherein each of the deformed conductive bumps comprises a base portion and a tip portion, and a curvature of the base portion is different from a curvature of the tip portion; and performing a singularizing process to the package on wafer structure on the tape carrier to form a plurality of package on package structures.

16. The manufacturing method of the package on package structure as claimed in claim 15, wherein method of forming the reconstructed wafer comprises:

providing a plurality of through vias on the carrier substrate;

providing the plurality of semiconductor devices on the carrier substrate, wherein the semiconductor devices are surrounded by the through vias;

encapsulating the plurality of semiconductor devices and the through vias by the encapsulating material; and forming a first redistribution structure on the first side of the reconstructed wafer, wherein the first redistribution structure is extended over the encapsulating material and the plurality of semiconductor devices.

17. The manufacturing method of the package on package structure as claimed in claim 15, wherein forming the first package on the carrier substrate further comprises:

forming a second redistribution structure on the carrier substrate before the plurality of semiconductor devices and the plurality of through vias are provided on the carrier substrate.

18. The manufacturing method of the package on package structure as claimed in claim 15, further comprising:

forming a patterned dielectric layer on the reconstructed wafer, wherein the patterned dielectric layer comprising a plurality of openings revealing a plurality of electrical contacts of the reconstructed wafer; and forming a plurality of solder materials in the openings, and the second package is mounted on the patterned dielectric layer and electrically connected to the solder materials.

19. The manufacturing method of the package on package structure as claimed in claim 15, wherein the singularizing process further comprises:

sawing the reconstructed wafer on the tape carrier to form the plurality of package on package structures.

20. The manufacturing method of the package on package structure as claimed in claim 19, wherein the singularizing process further comprises:

separating the plurality of package on package structures from the tape carrier by a plurality of poker pins poking under the tape carrier.

* * * * *